United States Patent
Wang et al.

(10) Patent No.: US 8,816,422 B2
(45) Date of Patent: Aug. 26, 2014

(54) MULTI-TRAPPING LAYER FLASH MEMORY CELL

(75) Inventors: Ming-Tsong Wang, Taipei (TW); Tong-Chern Ong, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 305 days.

(21) Appl. No.: 11/521,805

(22) Filed: Sep. 15, 2006

(65) Prior Publication Data

US 2008/0067577 A1 Mar. 20, 2008

(51) Int. Cl.
*H01L 29/788* (2006.01)
*H01L 29/792* (2006.01)
*H01L 29/423* (2006.01)
*H01L 21/28* (2006.01)
*G11C 11/56* (2006.01)
*G11C 16/04* (2006.01)
*G11C 16/10* (2006.01)

(52) U.S. Cl.
CPC ...... *H01L 29/42348* (2013.01); *H01L 29/7887* (2013.01); *H01L 21/28273* (2013.01); *H01L 29/7923* (2013.01); *G11C 11/5671* (2013.01); *H01L 21/28282* (2013.01); *G11C 16/0466* (2013.01); *G11C 16/10* (2013.01)
USPC ........... 257/324; 257/314; 257/315; 257/316; 257/321; 257/E29.308; 257/E29.309

(58) Field of Classification Search
CPC ............ H01L 29/7923; H01L 29/7887; H01L 29/788; H01L 29/792
USPC .............. 257/314–316, 321, 324–325, E29.3, 257/E29.309
See application file for complete search history.

(56) References Cited

U.S. PATENT DOCUMENTS

| | | | |
|---|---|---|---|
| 5,074,952 A | 12/1991 | Zavracky et al. | |
| 5,364,806 A | 11/1994 | Ma et al. | |
| 5,596,214 A * | 1/1997 | Endo ............................. | 257/324 |
| 6,031,263 A | 2/2000 | Forbes et al. | |
| 6,307,775 B1 | 10/2001 | Forbes et al. | |
| 6,617,639 B1 | 9/2003 | Wang et al. | |
| 6,709,928 B1 * | 3/2004 | Jenne et al. ................... | 438/264 |
| 6,933,218 B1 | 8/2005 | Lee et al. | |

(Continued)

FOREIGN PATENT DOCUMENTS

CN 1783457 A 6/2006

OTHER PUBLICATIONS

Eitan, B., et al., "4-bit per Cell NROM Reliability," IEEE, 2005, pp. 539-542.

(Continued)

*Primary Examiner* — Allison P Bernstein
(74) *Attorney, Agent, or Firm* — Slater and Matsil, L.L.P.

(57) ABSTRACT

A semiconductor device includes a semiconductor substrate, a top gate over the semiconductor substrate, and a stacked gate between the top gate and the semiconductor substrate. The stacked gate includes a first tunneling layer, a first storage layer adjoining the first tunneling layer, and an additional layer adjoining the first tunneling layer. The additional layer is selected from the group consisting of a retention layer and an additional composite layer. The additional composite layer comprises a second tunneling layer and a second storage layer adjoining the second tunneling layer. The semiconductor device further includes a blocking layer adjoining the first storage layer.

20 Claims, 14 Drawing Sheets

(56) References Cited

U.S. PATENT DOCUMENTS

| | | |
|---|---|---|
| 6,949,804 B2 | 9/2005 | Miyazaki |
| 6,958,513 B2 | 10/2005 | Wang |
| 7,112,539 B2 | 9/2006 | Lee et al. |
| 7,372,098 B2 | 5/2008 | Forbes |
| 7,420,256 B2 | 9/2008 | Chae et al. |
| 7,579,646 B2 | 8/2009 | Wang et al. |
| 7,763,927 B2 | 7/2010 | Wu et al. |
| 7,879,738 B2 | 2/2011 | Wang |
| 7,989,876 B2 | 8/2011 | Yasuda |
| 2002/0106536 A1 | 8/2002 | Lee et al. |
| 2004/0004247 A1 | 1/2004 | Forbes et al. |
| 2004/0032762 A1 | 2/2004 | Blanchard |
| 2004/0201069 A1 | 10/2004 | Miyazaki |
| 2004/0224459 A1 | 11/2004 | Nishikawa |
| 2004/0264236 A1 | 12/2004 | Chae et al. |
| 2005/0062098 A1 | 3/2005 | Mahajani et al. |
| 2005/0153571 A1 | 7/2005 | Senzaki |
| 2005/0199944 A1* | 9/2005 | Chen et al. ............ 257/324 |
| 2005/0205969 A1 | 9/2005 | Ono et al. |
| 2006/0044915 A1* | 3/2006 | Park et al. ............ 365/222 |
| 2006/0097306 A1* | 5/2006 | Kim et al. ............ 257/315 |
| 2006/0113586 A1* | 6/2006 | Wang ............ 257/324 |
| 2006/0261401 A1 | 11/2006 | Bhattacharyya |
| 2006/0273370 A1 | 12/2006 | Forbes |
| 2006/0281331 A1 | 12/2006 | Wang |
| 2007/0132010 A1 | 6/2007 | Bhattacharyya |
| 2007/0138539 A1 | 6/2007 | Wu et al. |
| 2007/0187730 A1 | 8/2007 | Park et al. |
| 2007/0272916 A1 | 11/2007 | Wang et al. |
| 2008/0012065 A1* | 1/2008 | Kumar ............ 257/324 |
| 2008/0073689 A1 | 3/2008 | Wang et al. |
| 2008/0073704 A1 | 3/2008 | Yasuda |
| 2010/0001335 A1 | 1/2010 | Wang et al. |

OTHER PUBLICATIONS

Green, M. L., et al., "Ultrathin (<4 nm) $SiO_2$ and Si—O—N gate dielectric layers for silicon microelectonics: Understanding the processing, structure, and physical and electrical limits," Journal of Applied Physics, vol. 90, No. 5, Sep. 1, 2001, 2001 American Institute of Physics, pp. 2057-2121.

Shappir, A., et al., "NROM Window Sensing for 2 and 4-bits per cell Products," IEEE, 2006, pp. 68-69.

Yokoyama, S., et al., "Characterization of plasma-enhanced chemically-vapor-deposited silicon-rich silicon dioxide/thermal silicon dioxide dual dielectric systems," Journal of Applied Physics, vol. 54, No. 12, Dec. 1983, 1983 American Instituted of Physics, pp. 7058-7065.

Goano, M., et al. "Band Structure Nonlocal Pseudopotential Calculation of the III-Nitride Wurtzite Phase Materials System. Part II. Ternary Alloys $Al_xGa_{1-x}N$, $In_xGa_{1-x}N$, and $In_xAl_{1-x}N$," Journal of Applied Physics, American Institute of Physics, Dec. 1, 2000, pp. 6476-6482, vol. 88, No. 11.

Pierret, Robert F., "vol. IV Field Effect Devices, $2^{nd}$ Edition, Modular Series on Solid State Devices," Addison-Wesley Publishing Company, Inc., 1990, Reading Massachusetts, 4 pages, Oct. 1992.

Neamen, Donald A., "Semiconductor Physics and Devices—Basic Principles," Richard D. Irwin, Inc., 1992, Burr Ridge, Illinois, pp. 60-77 and 717-719.

* cited by examiner

MULTI-TRAPPING LAYER FLASH MEMORY CELL

CROSS-REFERENCE TO RELATED APPLICATION

This application relates to the following commonly assigned U.S. patent application Ser. No. 11/440,667, filed May 25, 2006, entitled "Flash Memory with Deep Quantum Well and High-K Dielectric," which patent application is incorporated herein by reference.

TECHNICAL FIELD

This invention relates generally to semiconductor devices, and more particularly to memory cells, and even more particularly to a structure and manufacturing methods of flash memory cells.

BACKGROUND

Flash memory has become increasingly popular in recent years. A typical flash memory comprises a memory array having a large number of flash memory cells arranged in blocks. One of the most commonly known flash memories is the one-transistor flash memory, wherein each of the memory cells is fabricated as a field-effect transistor having a control gate and a floating gate. The floating gate is capable of holding charges and is separated from source and drain regions contained in a substrate by a layer of thin oxide (tunneling oxide). Each of the memory cells can be electrically charged by injecting electrons from the drain region through the tunneling oxide layer onto the floating gate. The charges can be removed from the floating gate by tunneling the electrons to the substrate through the tunneling oxide layer during an erase operation. Thus the data in a memory cell is determined by the presence or absence of charges in the floating gate.

It is highly desirable to scale down write/erase voltages of flash memory. This has typically been achieved by decreasing the thickness of the tunneling oxide layer. However, conventional one-transistor flash memory has a conductive storage layer, and thus thin tunneling oxide layers will cause a significant leakage problem. Stored charges are more likely to be leaked to the substrate through a thin tunneling oxide layer than through a thick tunneling oxide layer. Particularly, if there is a defect in the tunneling oxide layer, all stored charges can potentially leak through the defect since charges can flow freely in the floating gate.

One method for reducing the thickness of the tunneling oxide layer without causing severe charge loss is using a (poly-)Si—SiO$_2$—SiN—SiO$_2$—Si (SONOS) structure. FIG. 1 illustrates a conventional SONOS flash memory cell. A tunneling oxide layer 2 is formed on a silicon substrate 3. A silicon nitride layer (floating gate) 4 is located on tunneling oxide layer 2. Silicon nitride layer 4 comprises local traps for trapping and storing charges representing digital data "1" or "0." A blocking oxide 6 is formed on floating gate 4 to prevent charges from reaching gate electrode 8, which is typically formed of polysilicon.

In SONOS memory cells, charges are stored inside the discrete and electrically isolated traps of nitride (SiN), while only the trapped charges close to the oxide defects can leak out. Therefore, it is possible to store more than one bit in the silicon nitride layer 4. For example, by connecting the source region to ground and connecting the drain region to a high voltage, charges can be stored in region 10, which is on the right side of the illustrated structure. Conversely, by connecting the drain region to ground and connecting the source region to a high voltage, charges can be stored in region 12, which is on the left side of the illustrated structure. Furthermore, methods and structures for four-bit storage are being explored, wherein each side is used for storing two bits.

The existing flash memory cells, however, cannot save more than four bits per cell. Additionally, the conventional SONOS memory devices using silicon nitride as storage layers have the disadvantage of high conduction band discontinuity ($\Delta E_C$) with a silicon channel. As a result, charge leakage is still a problem and data retention time is adversely affected. To overcome these problems, relatively thick oxides are typically needed. However, thick oxides will cause an increase in write/erase voltages.

Accordingly, what is needed in the art is a flash memory cell having greater storage ability and a long data retention time.

SUMMARY OF THE INVENTION

In accordance with one aspect of the present invention, a semiconductor device includes a semiconductor substrate, a top gate over the semiconductor substrate, and a stacked gate between the top gate and the semiconductor substrate. The stacked gate includes a first tunneling layer, a first storage layer adjoining the first tunneling layer, and an additional layer adjoining the first tunneling layer. The additional layer is selected from the group consisting of a retention layer and an additional composite layer. The additional composite layer comprises a second tunneling layer and a second storage layer adjoining the second tunneling layer. The semiconductor device further includes a blocking layer adjoining the first storage layer.

In accordance with another aspect of the present invention, a semiconductor device includes a semiconductor substrate and at least two composite layers stacked over the semiconductor substrate, wherein each of the at least two composite layers comprises a tunneling layer and a storage layer on the tunneling layer, and wherein each tunneling layer in the at least two composite layers has a band gap no smaller than band gaps of underlying tunneling layers, and wherein at least one tunneling layer in the at least two composite layers has a greater band gap than band gaps of the underlying tunneling layers. The semiconductor device further includes a blocking layer over the at least two composite layers, a top gate over the blocking layer, and a source/drain region in the semiconductor substrate and adjacent the at least two composite layers.

In accordance with yet another aspect of the present invention, a semiconductor device includes a semiconductor substrate, a retention layer on the semiconductor substrate, and at least one composite layer stacked on the retention layer, wherein each of the at least one composite layer comprises a tunneling layer and a storage layer on the tunneling layer, and wherein the retention layer has a greater band gap than an adjoining tunneling layer. The semiconductor device further includes a blocking layer over the at least one composite layer, a top gate over the at least one composite layer, and a source/drain in the semiconductor substrate and adjacent the retention layer.

In accordance with yet another aspect of the present invention, a semiconductor device includes a semiconductor fin on a top surface of a substrate wherein the semiconductor fin has two sidewalls and a top surface and wherein the semiconductor fin comprises a middle channel section and two source/drain regions, a top gate over the top surface and around the two sidewalls of the semiconductor fin, a stacked gate between the top gate and the semiconductor fin wherein the stacked gate comprises a first tunneling layer and a first storage layer adjoining the first tunneling layer, and an additional layer adjoining the first tunneling layer. The additional layer is selected from the group consisting of a retention layer and an additional composite layer, wherein the additional composite layer comprises a second tunneling layer and a second storage layer adjoining the additional tunneling layer. The semiconductor device further includes a blocking layer adjoining the first storage layer.

In accordance with yet another aspect of the present invention, a method of forming a semiconductor device includes providing a semiconductor substrate, forming a top gate over the semiconductor substrate, and forming a stacked gate between the top gate and the semiconductor substrate. The step of forming the stacked gate includes forming a first tunneling layer, forming a first storage layer adjoining the first tunneling layer, and forming an additional layer adjoining the first tunneling layer, wherein the additional layer is selected from the group consisting of a retention layer and an additional composite layer, and wherein the additional composite layer comprises a second tunneling layer and a second storage layer adjoining the second tunneling layer. The method further includes forming a blocking layer adjoining the first storage layer.

In accordance with yet another aspect of the present invention, a method of operating a multi-trapping layer (MTL) flash memory cell includes providing the MTL flash memory cell, which comprises a semiconductor substrate, a top gate over the semiconductor substrate, and a stacked gate between the top gate and the semiconductor substrate. The stacked gate comprises a first tunneling layer, a first storage layer adjoining the first tunneling layer, and an additional layer adjoining the first tunneling layer, wherein the additional layer is selected from the group consisting of a retention layer and an additional composite layer, and wherein the additional composite layer comprises a second tunneling layer and a second storage layer adjoining the second tunneling layer. The MTL flash memory cell further includes a blocking layer adjoining the first storage layer. The method further includes programming the MTL flash memory cell by applying a first voltage between the top gate and the substrate and erasing the MTL flash memory cell by applying a second voltage between the top gate and the substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
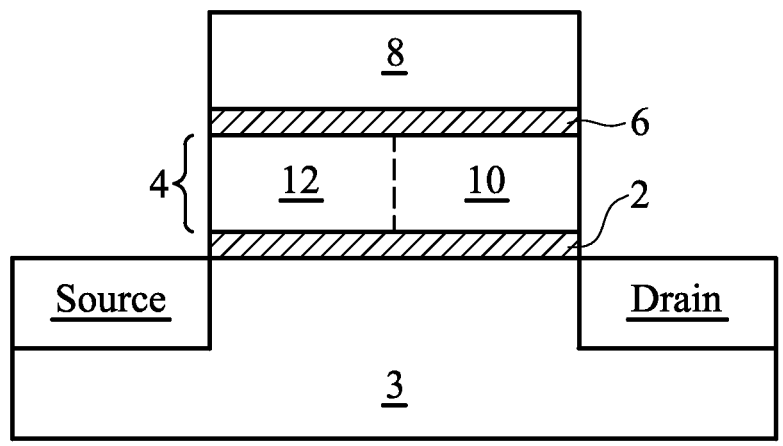
FIG. 1 illustrates a cross-sectional view of a conventional SONOS flash memory cell.
Figure 2:
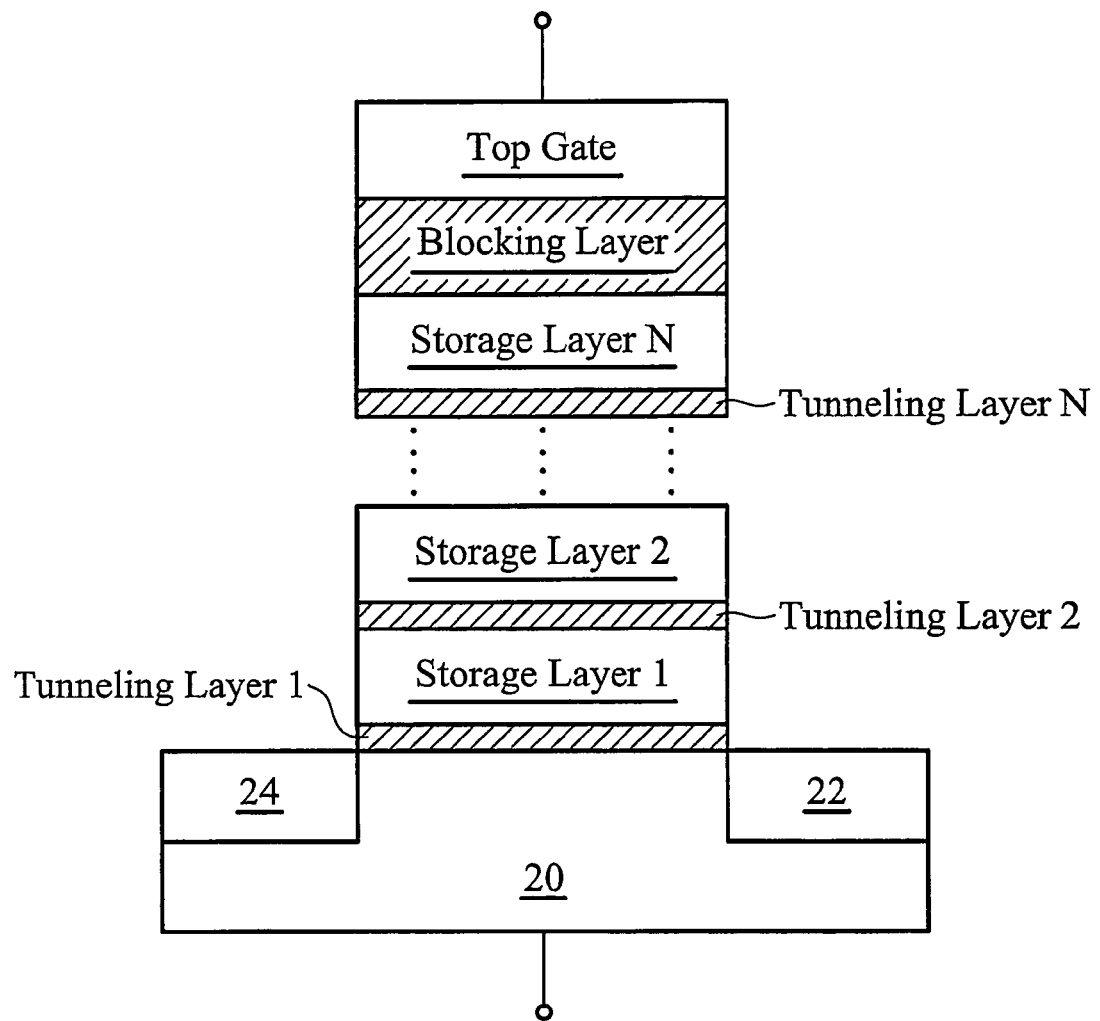
FIG. 2 illustrate a cross-sectional view of an embodiment of the present invention, wherein more than one storage layer is formed.

FIG. 2 illustrates a first embodiment of the present invention, wherein a flash memory cell is formed at a top surface of a substrate 20. In one embodiment, substrate 20 is formed of a bulk material such as silicon or silicon germanium. In alternative embodiments, substrate 20 has a silicon-on-insulator (SOI) structure. Substrate 20 may be lightly doped with a p-type or an n-type impurity. A drain region 22 and a source region 24, which may include either p-type or n-type impurities, are formed in substrate 20.

A gate stack, which includes a plurality of storage layers, a plurality of tunneling layers, and a blocking layer, is formed on substrate 20. The plurality of storage layers are referred to as storage layer 1, storage layer 2, . . . , and storage layer N. The storage layers (and substrate 20) are separated by a plurality of tunneling layers, namely tunneling layer 1, tunneling layer 2, . . . , and tunneling layer N wherein N is an integer greater than zero. Each of the storage layers 1 through N is preferably formed of materials having a charge storage ability, including, but not limited to, nitrides, polysilicon, metal-containing materials, AlN, AlGaN, nano crystal, and combinations thereof.

Storage layers 1 through N may be formed of dielectric materials having high trap densities, so that the charge storage ability is high. In the preferred embodiment, tunneling layers 1 through N each comprise $SiO_2$. Alternatively, tunneling layers 1 through N may be formed of high-k materials. Further details regarding the materials of tunneling layers and storage layers are provided in subsequent paragraphs.

A blocking layer is formed on the storage layer N. Preferably, the blocking layer has a low leakage of charges. Accordingly, the blocking layer preferably has a high conduction band, so that the barrier height between the conduction band of the blocking layer and the conduction band of the top gate is high, preferably greater than about 3.1 eV. The blocking layer is preferably formed of a high-k dielectric material, such as $AlLaO_3$, $HfAlO_3$, $HfO_2$, $Ta_2O_5$, $Al_2O_3$, $ZrO_2$, $TiO_2$, $SrTiO_3$, and combinations thereof. The k value of the blocking layer is preferably greater than about 3.9, and more preferably greater than about 9. The use of a high-k dielectric material will cause a lower voltage drop in the blocking layer, and thus the voltage drop in the tunneling layers is increased accordingly, making program and erase operations more efficient. As a result, program and erase voltages can be reduced accordingly.

The top gate is formed of conductive materials, including, but not limited to, n-type doped polysilicon, p-type doped polysilicon, metals, metal silicides, and combinations thereof.

Figure 3:
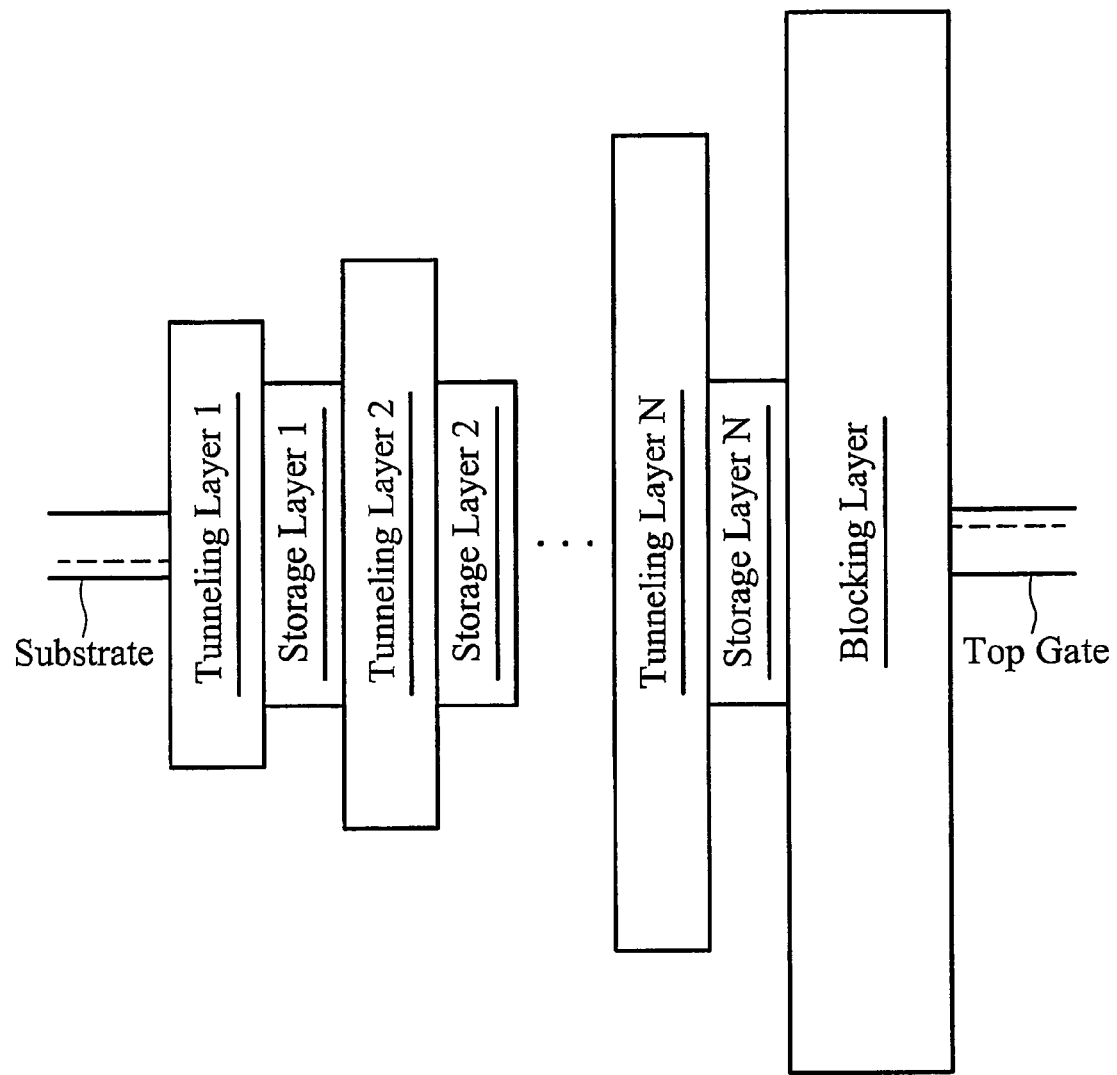
FIG. 3 illustrates an energy band diagram of an embodiment of the present invention.

FIG. 3 schematically illustrates an energy band diagram of the preferred embodiment shown in FIG. 2, wherein an exemplary top gate is formed of doped polysilicon. In the preferred embodiment, from tunneling layer 1 through tunneling layer N, each tunneling layer has a conduction band at least equal to, and more preferably higher than, the conduction bands of the underlying tunneling layers, and each tunneling layer has a valence band at least equal to, and more preferably lower than, the valence bands of the underlying tunneling layers. Accordingly, the band gap of each tunneling layer is at least equal to, and more preferably greater than, the band gaps of the underlying tunneling layers. In other embodiments, at least one tunneling layer has a band gap greater than the underlying tunneling layers, and the remaining tunneling layers all have equal band gaps. In yet other embodiments, all tunneling layers have substantially the same conduction bands, valence bands, and/or band gaps.

In the preferred embodiment, to achieve the preferred energy band diagram shown in FIG. 3, different materials are used to form the tunneling layers 1 through N. In an exemplary embodiment, all the tunneling layers 1 through N include $SiO_2$. Impurities, such as nitrogen and additional silicon, are added to adjust the conduction bands and valence bands of the tunneling layers 1 through N. Preferably, from tunneling layer 1 through tunneling layer N, a decreasing amount of nitrogen and/or silicon is added. In a first example, nitrogen contained in tunneling layers 1, 2, 3 and 4 are 25 percent, 20 percent, 15 percent, and 10 percent in percentages, respectively. In a second example, additional silicon contained in tunneling layers 1, 2, 3 and 4 are 20 percent, 15 percent, 10 percent, and 5 percent in percentages, respectively. It should be realized that the nitrogen and/or additional silicon percentages in tunneling layer 1 can be higher or lower than in the above-discussed examples. Also, the percentage differences between adjacent tunneling layers may be greater or smaller than five percent.

The addition of nitrogen into $SiO_2$ has the effect of lowering the band gaps of tunneling layers, and the more nitrogen that is added, the lower the band gaps. Similarly, the addition of extra silicon into $SiO_2$ has the effect of lowering the barrier height of the $SiO_2$ layer with the neighboring layers. Therefore, the addition of both nitrogen and silicon contributes to the formation of the desired energy band diagram as shown in FIG. 3.

In alternative embodiments, each of the tunneling layers 1 through N may be formed of different materials, and the materials are selected to achieve the desired energy band diagram as shown in FIG. 3. In yet other embodiments, $SiO_2$ (with different amount of nitrogen and/or additional silicon) may be combined with the use of different materials (other than $SiO_2$) to form desirable tunneling layers.

In yet other embodiments, all tunneling layers 1 through N may be formed of a same material, such as $SiO_2$. Therefore, the conduction bands and valence bands of the tunneling layers will be the same. However, compared to the embodiment shown in FIG. 3, the programming and erasing of this embodiment is relatively harder to control. The detailed discussion is provided in subsequent paragraphs.

Figure 4A:
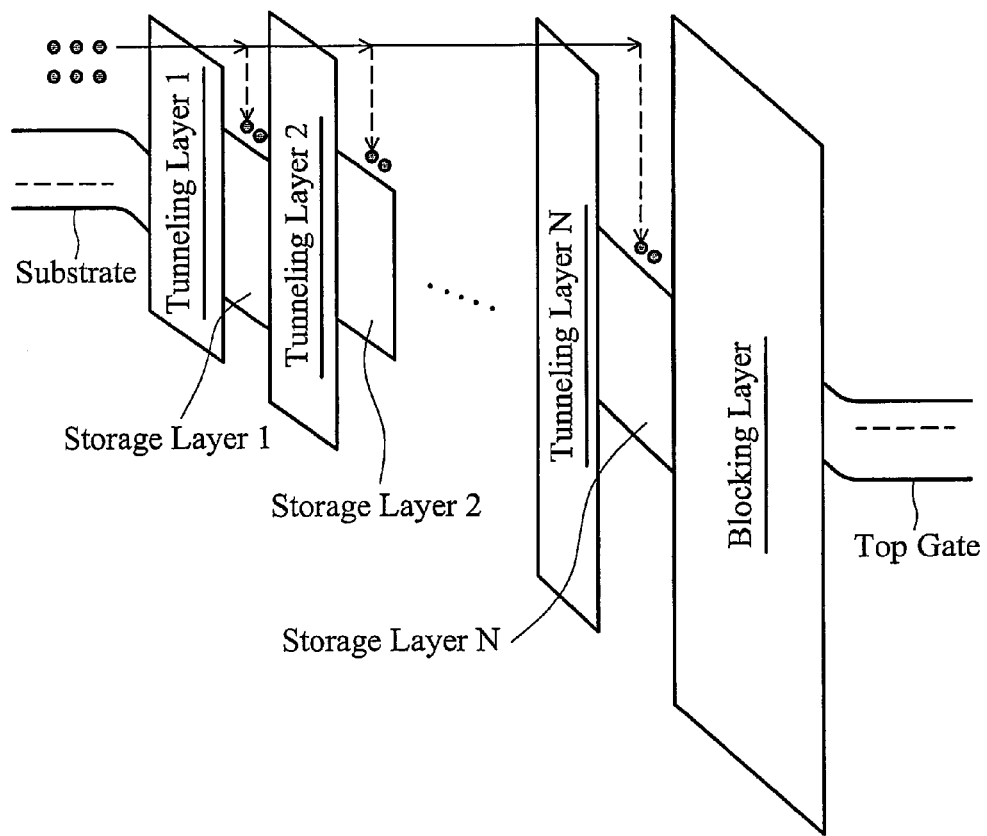
FIG. 4A illustrates an energy band diagram of an embodiment of the present invention during a program operation, wherein electrons face further energy barriers after tunneling through a first tunneling layer.
Figure 4B:
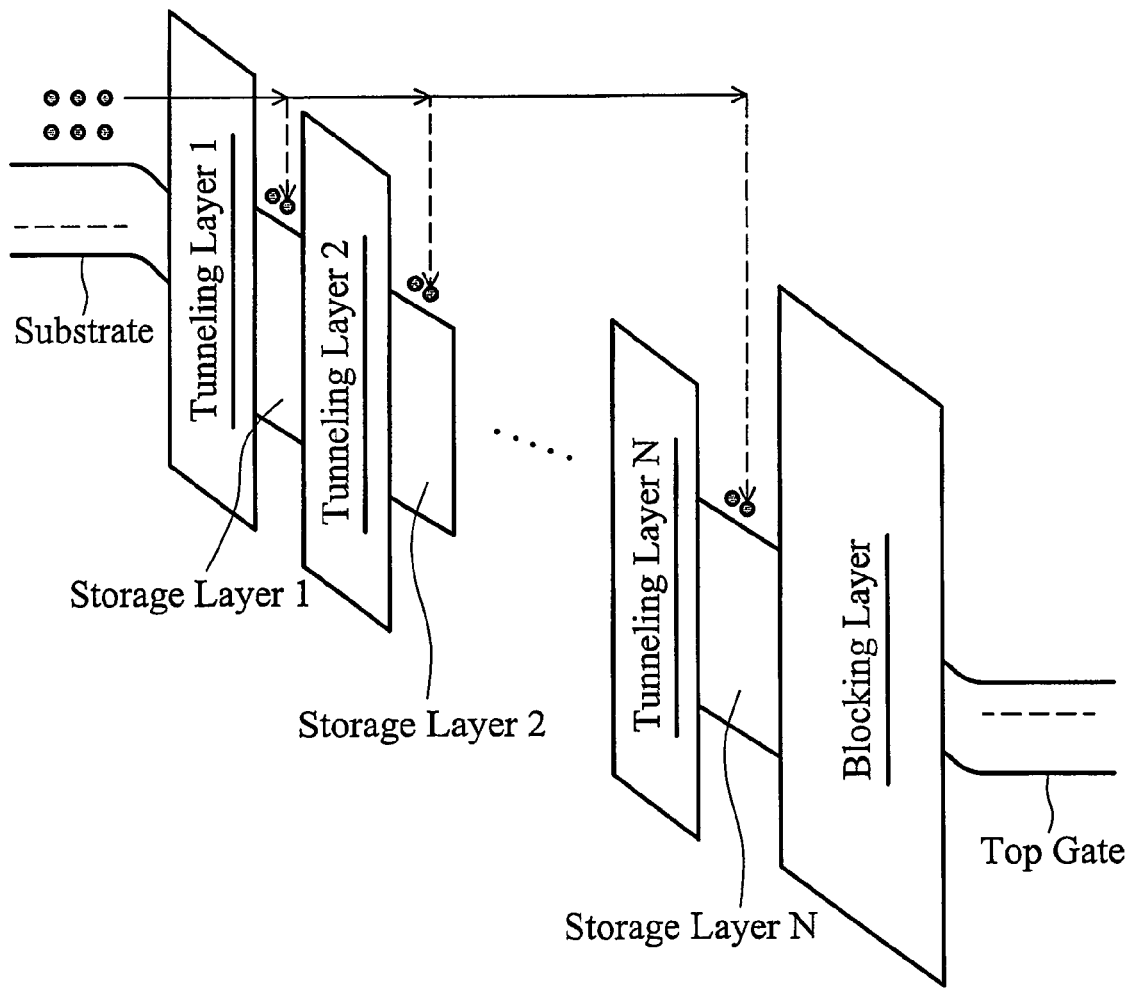
FIG. 4B illustrates an energy band diagram of an embodiment of the present invention during a program operation, wherein electrons face no further energy barriers after tunneling through a first tunneling layer.

The program operation of the multi-trapping layer (MTL) flash memory cell can be performed by applying a voltage between the top gate and substrate 20, with the voltage applied to the top gate being higher than the voltage applied on substrate 20 (refer to FIG. 2). Under the influence of the electrical field, electrons in substrate 20 penetrate the tunneling layers and are programmed into the storage layers. FIG. 4A schematically illustrates an energy band diagram in a program operation. In the preferred embodiment wherein the tunneling layers 1 through N have increasing band gaps, the conduction bands of higher level tunneling layers are still high, even though their conduction bands are lowered by the voltage applied on the top gate. As a result, even when electrons penetrate tunneling layer 1, they still face further barriers for penetrating remaining tunneling layers 2 through N. To penetrate each of the additional tunneling layers, electrons need additional energy. Therefore, electrons can be programmed into a specific tunneling layer (symbolized by dotted arrows), for example, by controlling the voltage applied on the top gate. Higher voltages tend to cause the higher bits (storage layers closer to the top gate), to be programmed, while lower voltages tend to cause the lower bits to be programmed. In comparison, if all tunneling layers 1 through N are formed of a same material, the energy band diagram will be similar to what is shown in FIG. 4B. It is noted that after penetrating tunneling layer 1, electrons face no further barriers, since the conduction bands of tunneling layers 2 through N are lower then the energy level of the electrons. The movement of electrons in tunneling layers 2 through N is ballistic, and electrons can land in any of the tunneling layers 2 through N (symbolized by dotted arrows). It is thus more difficult to control the programming of the MTL flash memory cell shown in FIG. 4B in a systematic manner.

Figure 5A:
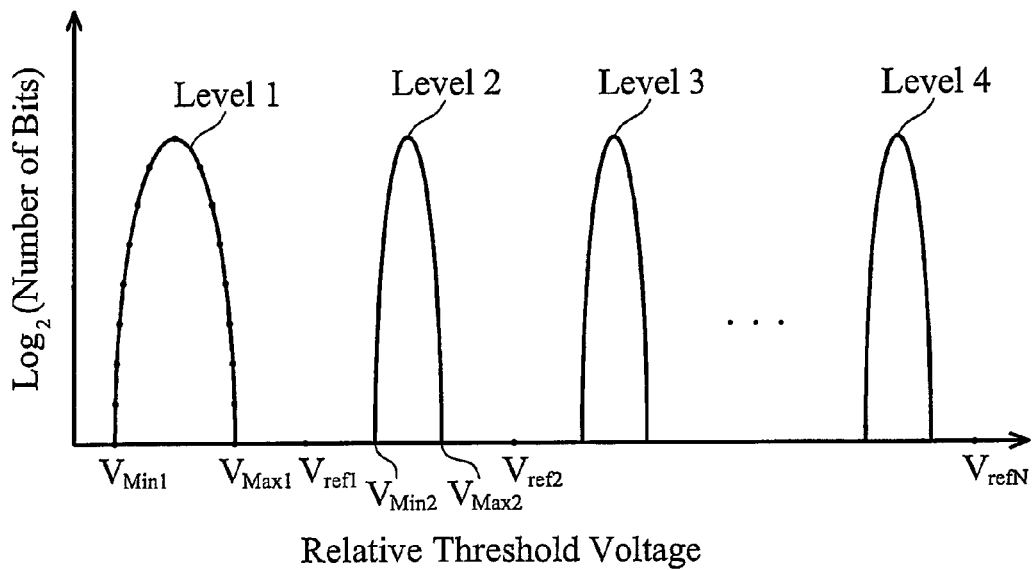
FIG. 5A illustrates the number of flash memory cells as a function of relative threshold voltages, wherein each storage layer stores one bit.

The electrons in MTL flash memory cells affect the charge distribution in the channel region, and thus cause a change in the threshold voltage. FIG. 5A, which is a result of measuring a large number of flash memory cells, illustrates the number of flash memory cells (in log scaled) having certain threshold voltages as a function of threshold voltages, wherein the threshold voltages are grouped as different levels. When electrons are stored in a storage layer, the threshold voltage will change, which can be detected by a control circuit specially designed for detecting threshold voltages of memory cells. The detected threshold voltage varies in a specific range. For example, with no electrons programmed into storages layers, the detected threshold voltage of a MTL flash memory cell varies in the range of the first peak (marked as level 1), which is between a maximum threshold voltage Vmax1 and a minimum threshold voltage Vmin1. Therefore, if any cell is found to have a threshold voltage between Vmax1 and Vmin1, it is determined that none of the storage layers are programmed. The programming of electrons into storage layer 1 will cause the threshold voltage of the memory cell to increase, for example, to a value between Vmax2 and Vmin2, which corresponds to a peak marked as level 2. Continuing programming more electrons will cause the threshold voltage to increase to higher values such as level 3 and level 4. Levels 1, 2, 3 and 4 may be used to indicate states of (0,0), (0, 1), (1, 0) and (1, 1), and thus two bits may be represented. Therefore, by storing and determining the threshold voltage of a memory cell, the states of two bits can be programmed determined for storage layer 1. Similarly, storage layers 1 to 4 may represent four bits, with storage layer 1 giving the $1^{st}$ to $4^{th}$ lower levels and storage layer 4 giving the $13^{th}$ to $16^{th}$ higher levels. Accordingly, $2^4$ levels are needed to representing four bits.

Figure 5B:
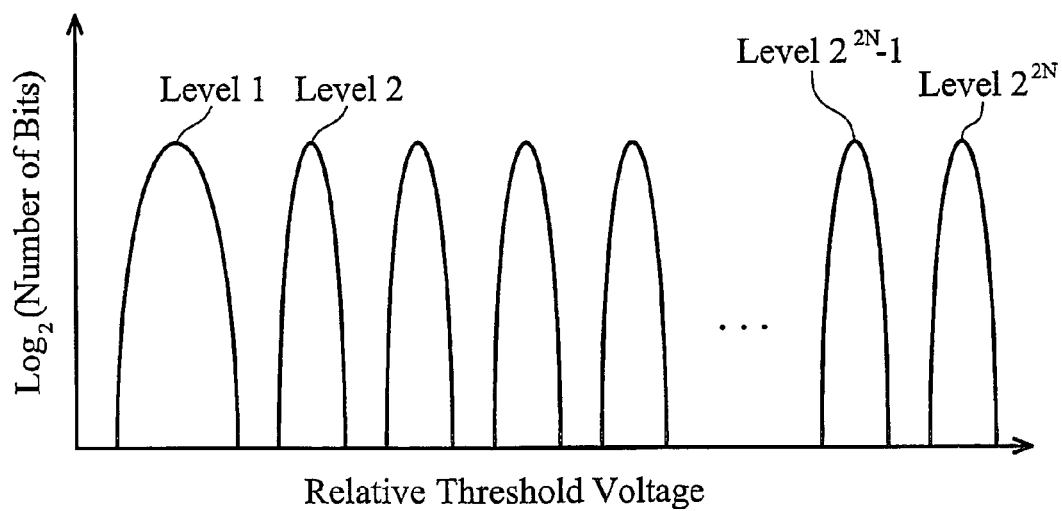
FIG. 5B illustrates the number of flash memory cells as a function of relative threshold voltages, wherein each storage layer stores two bits.

Referring to FIG. 5B, for storage layers 1 through N, $2^{2N}$ levels of threshold voltages will be observed, wherein higher level of storage layers correspond to higher threshold voltages. Programming a certain amount of electrons into a specific storage layer is controlled by the control circuit. Similarly, determining a threshold voltage and determining, which bits are programmed, are also performed by the control circuit.

An alternative way to determine whether a storage layer is programmed is to determine reference voltages Vref1 through VrefN, which are preferably the middle points between neighboring peaks. This process involves measuring a large number of samples to determine the values of Vref1 through VrefN, and then determining the threshold voltage of a flash memory cell. By determining between which two neighboring reference voltages the detected reference voltage is, the programmed storage layers (and the corresponding bits) of the flash memory cell can be determined. The preferred embodiment thus can be used for multi-bit programming.

To reduce the possibility of erroneous programming and reading, the peaks shown in FIGS. 5A and 5B are preferably evenly distributed and distinct from each other. This can be achieved by adjusting the thicknesses of the tunneling layers 1 through N, the thicknesses of the storage layers 1 through N, and the conduction bands and valence bands of the tunneling layers 1 through N. As has been discussed in preceding paragraphs, the conduction bands and valence bands of the tunneling layers can be adjusted by changing the materials of the tunneling layers, and one exemplary method is to add impurities.

The preferred embodiments of the present invention are capable of four-bit programming for each storage layer. Referring back to FIG. 2 again and using storage layer 1 as an example, electrons can be programmed into left portion and/or right portion. To program electrons into the right portion, in addition to the voltages applied to substrate 20 and the top gate, a high voltage is applied to drain region 22, and a low voltage is applied to source region 24. Conversely, to program electrons into the left portion, a high voltage is applied to the source region 24, and a low voltage is applied to drain region 22.

Figure 6:
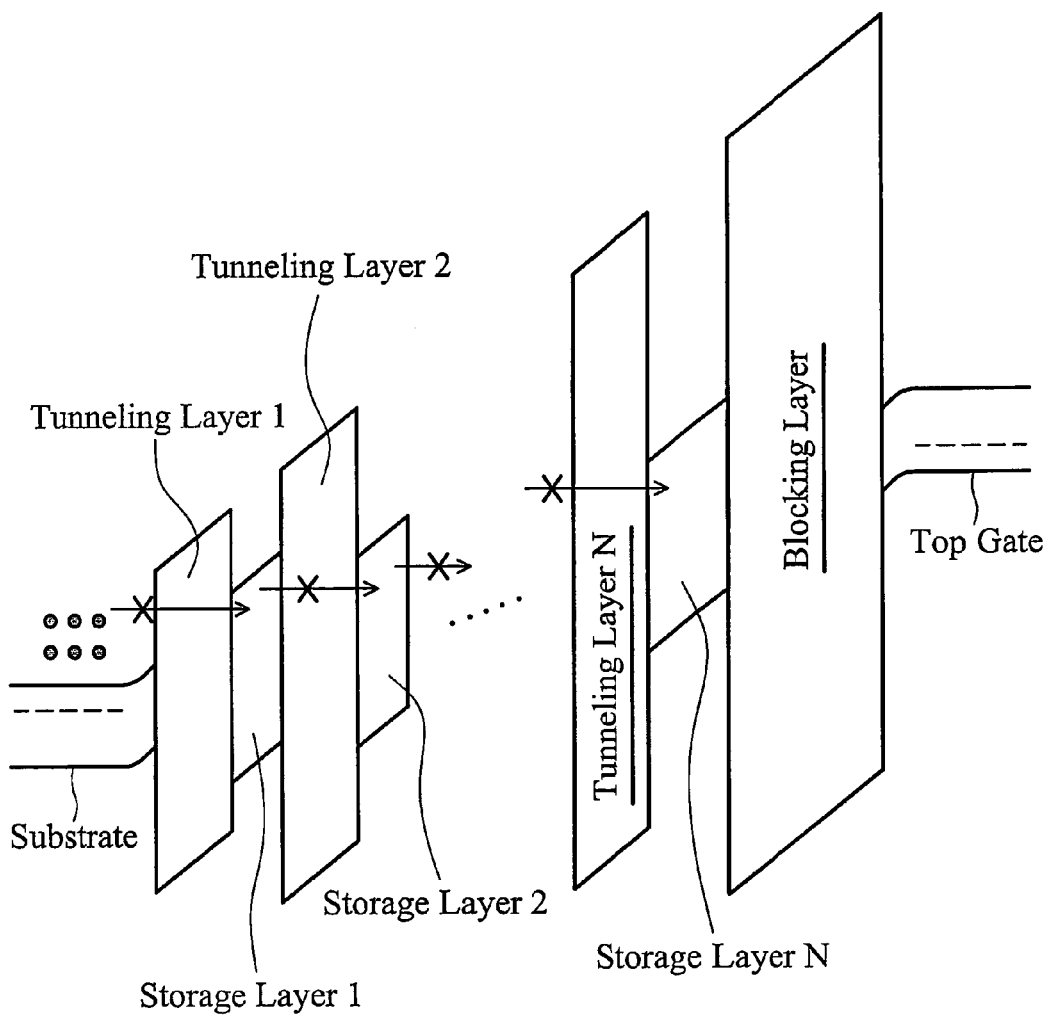
FIG. 6 illustrates a self-limiting effect occurring during a program operation.

An advantageous feature of the MTL flash memory cell is that it is self-limiting. When the electrons are programmed and built-up, the energy levels (conduction bands) of the storage layers and tunneling layers become higher, and thus the energy band diagram will transition from what is shown in FIG. 4A to what is shown in FIG. 6. With the increase of the conduction bands of storage layers on the right side of the diagram, electrons will face increasing energy barriers, and, eventually, the conduction band of the overlying storage layers will surmount the energy level of the electrons to be injected, and thus the electrons can no longer penetrate the tunneling layers (symbolized by the x'd arrows), and the program operation is completed.

Figure 7:
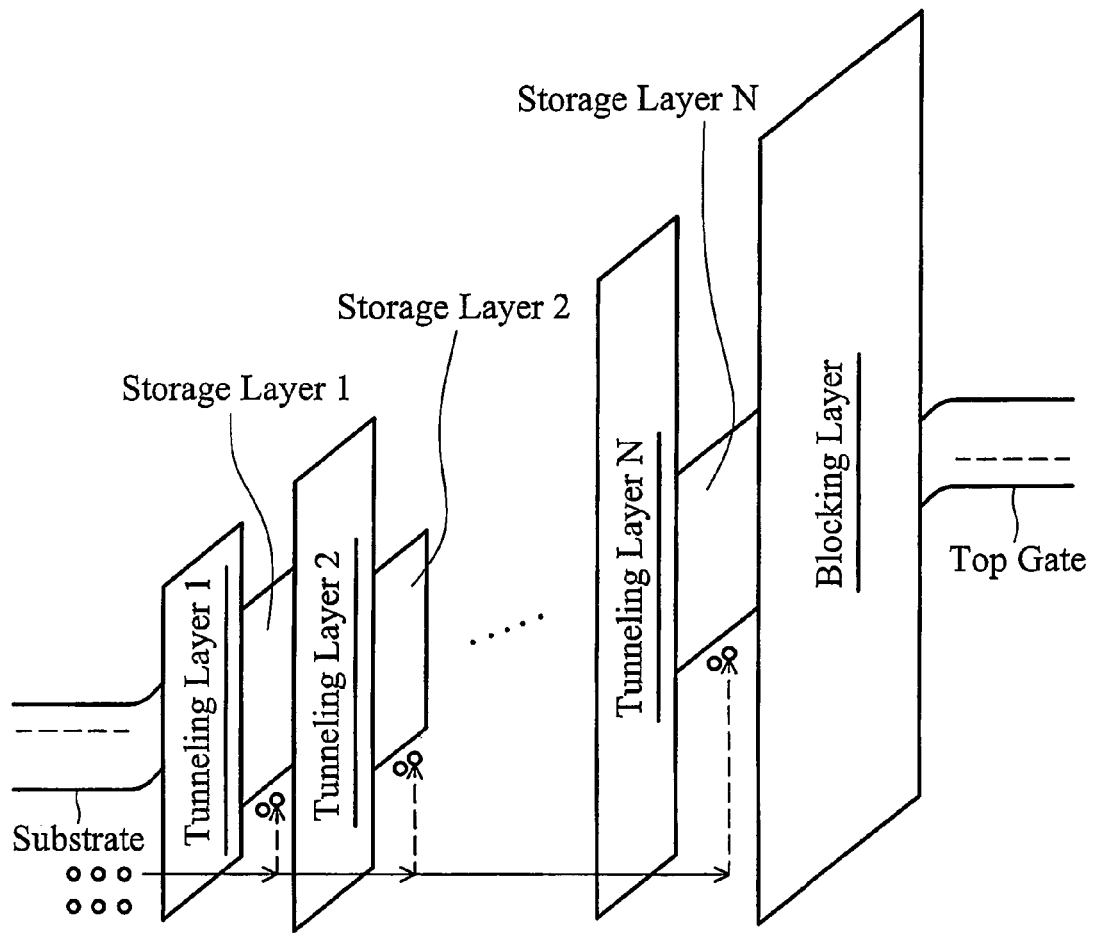
FIG. 7 illustrates an energy band diagram of an embodiment of the present invention during an erase operation.

FIG. 7 illustrates a schematic energy band diagram of an erase operation, which is preferably performed by applying a voltage between substrate 20 and the top gate, with the voltage at substrate 20 being higher. Under the influence of the electrical field, holes penetrate into the storage layers to neutralize the stored electrons (equivalent to discharging electrons from the storage layers into substrate 20). Again, since storage layers 1 through N have increasing conduction bands, valence bands, and band gaps, each of the tunneling layers will act as an energy barrier for the holes, and thus the erase operation is controllable. The charges for multi-bit programmed MTL cells can also be erased by controlling the voltages applied on the source/drain regions and the voltages applied between the top gate and substrate 20.

Figure 8:
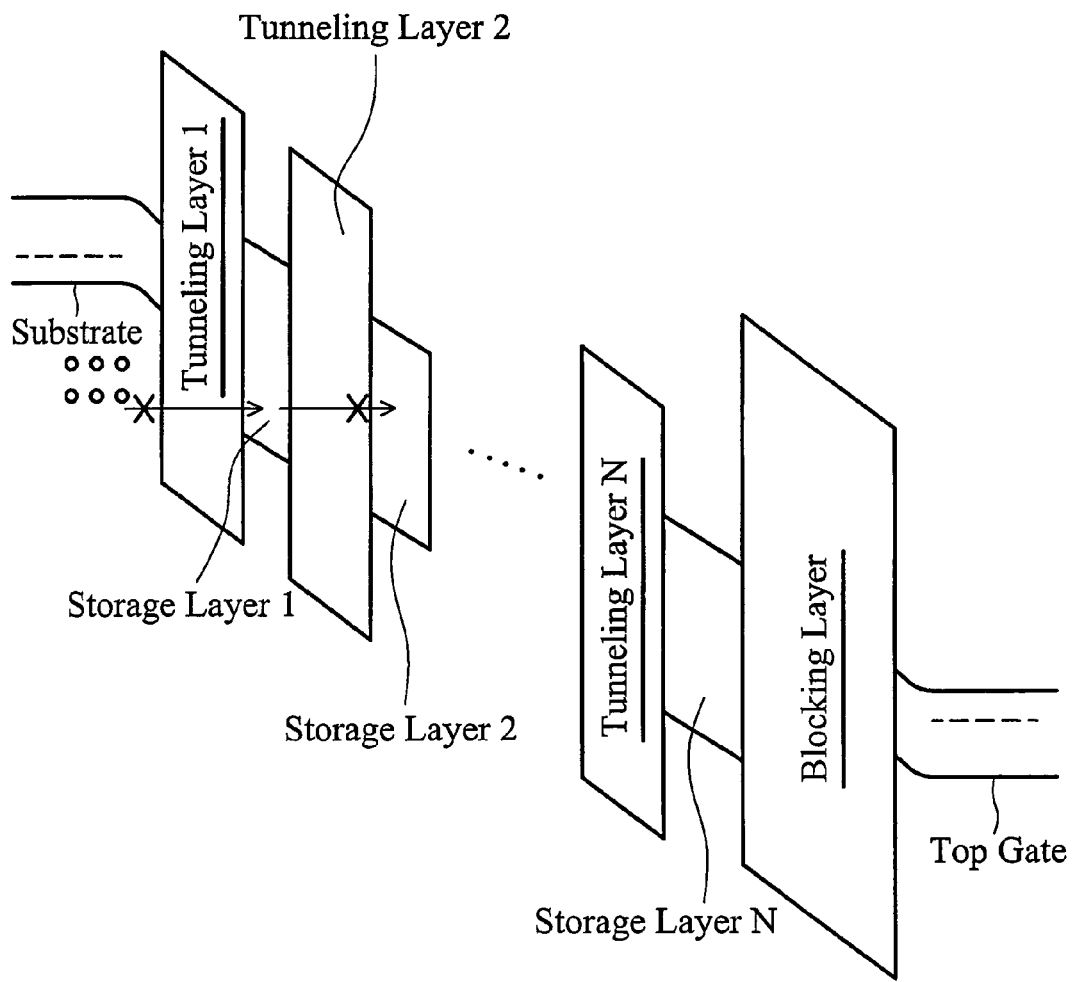
FIG. 8 illustrates a self-limiting effect occurring during an erase operation.

Similar to the program operation, the erase operation is also self-limiting. As the holes are driven into storage layers, the energy level of the storage layers and tunneling layers becomes lower, and thus the energy band diagram will transition from what is shown in FIG. 7 to what is shown in FIG. 8. With the decrease of the valence bands of storage layers on the right side of the diagram, holes will face increasing energy barriers, and, eventually, the valence bands of the overlying storage layers will surmount the energy level of the holes to be injected, and thus the holes can no longer penetrate the tunneling layers (symbolized by x'd arrows), and the erase operation is completed.

In the preferred embodiment of the present invention, the mechanism used for program and erase operations can be controlled. For example, by forming thinner tunneling layers, direct tunneling will dominate the program and erase operations. By forming thicker tunneling layers and increasing the program and erase voltages, Folwer-Nordheim (FN) tunneling will dominate the program and erase operations. If ballistic program and erase operations are preferred, the band gap of the tunneling layers can be made smaller. If hot electron (hole) program and erase operations are preferred, greater voltages between the source/drain regions can be applied.

Figure 9A:
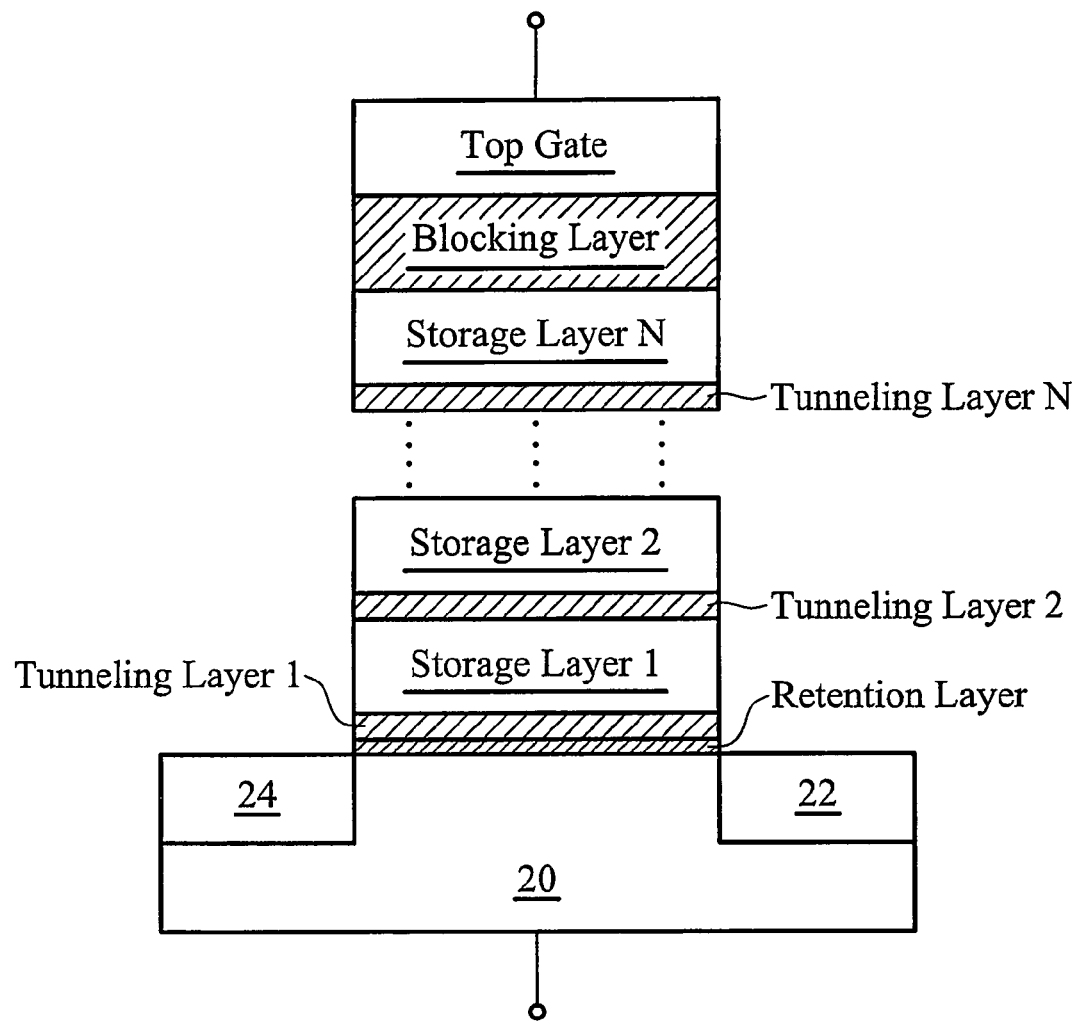
FIG. 9A illustrates an embodiment of the present invention, wherein a retention layer is formed between a first tunneling layer and a semiconductor substrate.
Figure 9B:
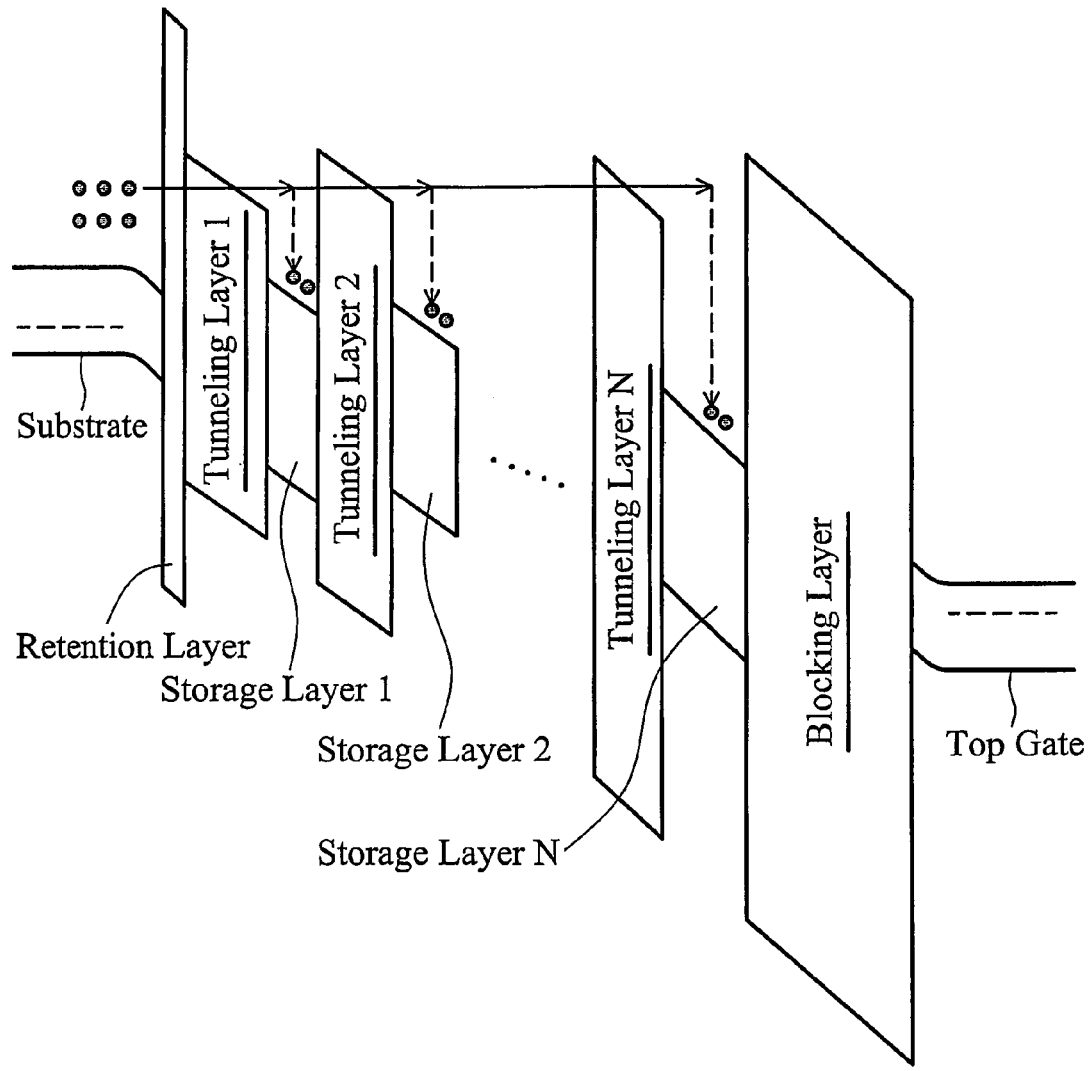
FIG. 9B illustrates an energy band diagram of the embodiment shown in FIG. 9B during a program operation.

Referring back to FIG. 4A, tunneling layer 1 has a low band gap with a low conduction band and a high valence band. This improves the controllability of the program and erase operations. However, the charge retention ability is adversely affected. Referring to FIG. 9A, a thin silicon oxide layer (referred to as a retention layer hereinafter) is added between substrate 20 and tunneling layer 1 to enhance data retention ability. The retention layer preferably has a greater band gap than tunneling layer 1 (refer to FIG. 9B), and is preferably thin, so that direct tunneling can easily occur. In one embodiment, the retention layer is formed of silicon oxide with no impurities added. In other embodiments, the retention layer is formed of materials having band gaps greater than that of $SiO_2$ if impurities are doped into $SiO_2$, such as $Al_2O_3$, HfAlO, and the like. The thickness of the retention layer is preferably less than about 50% of the thickness of tunneling layer 1.

Besides embodiments discussed in the preceding paragraphs, various materials can be used to form the MTL flash memory cells. Some of these materials and formation details have been discussed in co-pending patent application Ser. No. 11/440,667, which is incorporated herein by reference. In one embodiment, the tunneling layers can be formed of high-k dielectric materials, such as HfAlO, $HfO_2$, $Ta_2O_5$, $ZrO_2$, and the like. An advantageous feature for using a high-k dielectric material is that a barrier height between high-k tunneling layer 1 and the underlying silicon substrate 20 is typically low, making programming and erasing easier. This is particularly advantageous for the preferred embodiments with multiple storage layers, which have high gate stacks, and thus the electrical fields in the tunneling layers and storage layers are low due to the great thickness.

In the preferred embodiment, the storage layers 1 through N preferably comprise aluminum nitride (AlN). In other embodiments, the storage layers may include other high-k dielectric materials including oxides, nitrides and oxynitrides, such as $Si_3N_4$, $Al_2O_3$, $HfO_2$, HfON, ZrON, and combinations thereof. An advantageous feature of using AlN in the storage layers is that its conduction band is lower than the conduction band of the commonly used $Si_3N_4$, thus the band discontinuity between storage layer 1 and silicon substrate 20 is lowered resulting in a reduced leakage for charges stored in the storage layers. In more preferred embodiments, the storage layers further comprise Ga or GaN in addition to AlN, forming AlGaN. In yet other embodiments, a dual phase structure may be formed in the storage layers. Besides the dielectric materials (such as AlN or AlGaN) in the storage layers, the dual phase structure may also include nano crystal islands isolated by the dielectric materials. Such crystal islands have high charge-storage ability, sometimes comparable to the charge-storage ability of metals. The storage ability of the storage layers with a dual phase structure is thus high.

Figure 10:
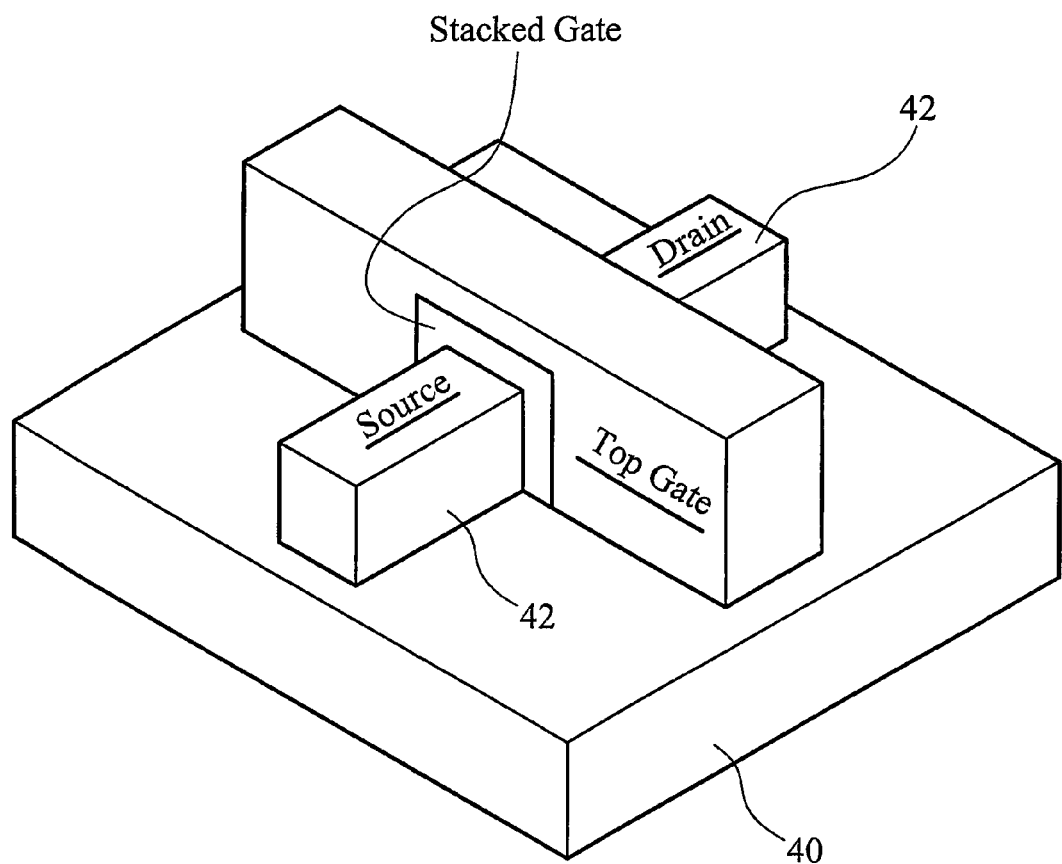
FIG. 10 illustrates a three-dimensional structure of the preferred embodiment.

The MTL memory cell illustrated in FIG. 2 is two-dimensional (or planar). The MTL memory cells may also have a three-dimensional structure, also referred to as a FinFET structure, as is shown in FIG. 10. A MTL memory cell is formed on a substrate 40, which may be a semiconductor substrate or an insulator. A semiconductor strip 42 is formed on substrate 40. A top gate wraps around the two sides and the top of semiconductor strip 42. The stacked gate includes one or more tunneling layers, one or more storage layers, a blocking layer and an optional retention layer (refer to FIGS. 2 and 9A). Source/drain regions are the portions of semiconductor strip 42 located on opposing sides of the stacked layers and the top gate.

Figure 11:
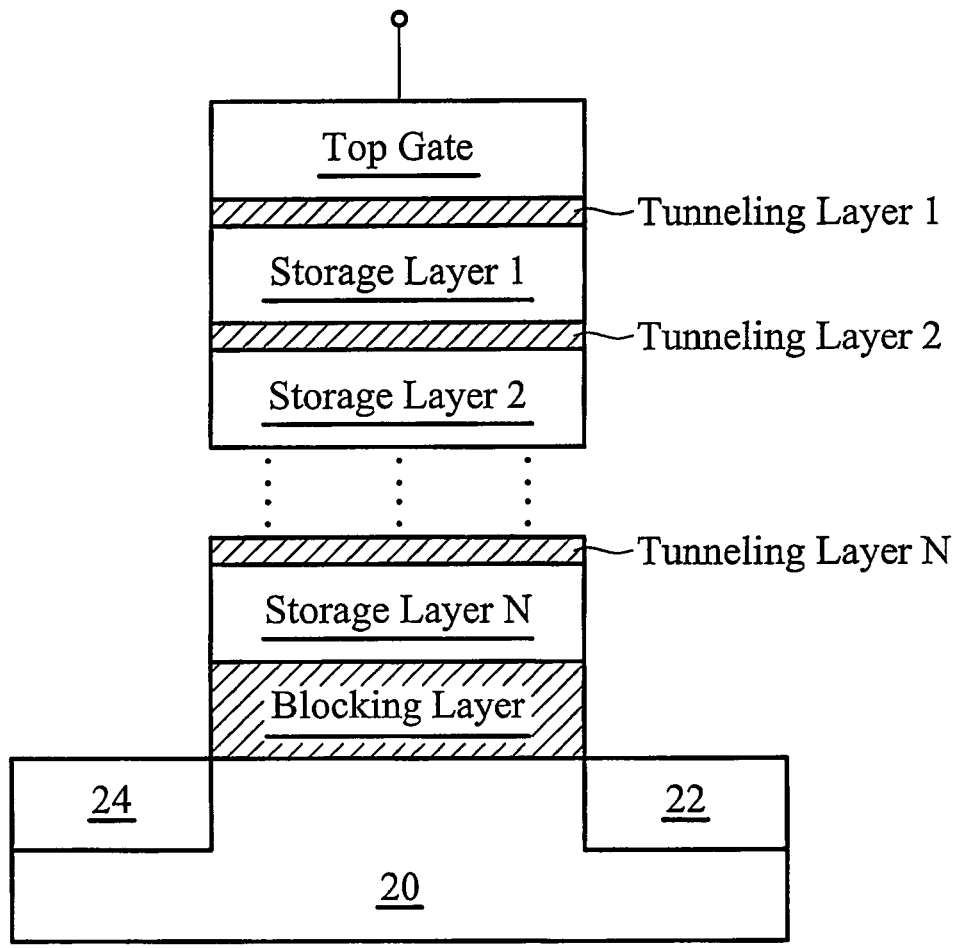
FIGS. 11 and 12 illustrate embodiments of the present invention, wherein the flash memory cells are gate programmed.

FIG. 11 illustrates a variation of the preferred embodiment, which is essentially a version of the structure shown in FIG. 2 with the gate stack between substrate 20 and the top gate turned upside down. The specifications of the components shown in FIG. 11 are essentially the same as the embodiment shown in FIG. 2. In this embodiment, the blocking layer is formed on substrate 20. The tunneling layers and storage layers N through 1 are then formed alternately over the blocking layer. This embodiment is preferably programmed and erased through the top gate. In program operations, a voltage is applied between substrate 20 and the top gate with substrate 20 having a higher voltage than the top gate. Electrons are programmed into the storage layers 1 through N from the top gate. In erase operations, a voltage is applied between substrate 20 and the top gate with substrate 20 having a lower voltage than the top gate, and holes are driven into the storage layers 1 through N from the top gate.

Figure 12:
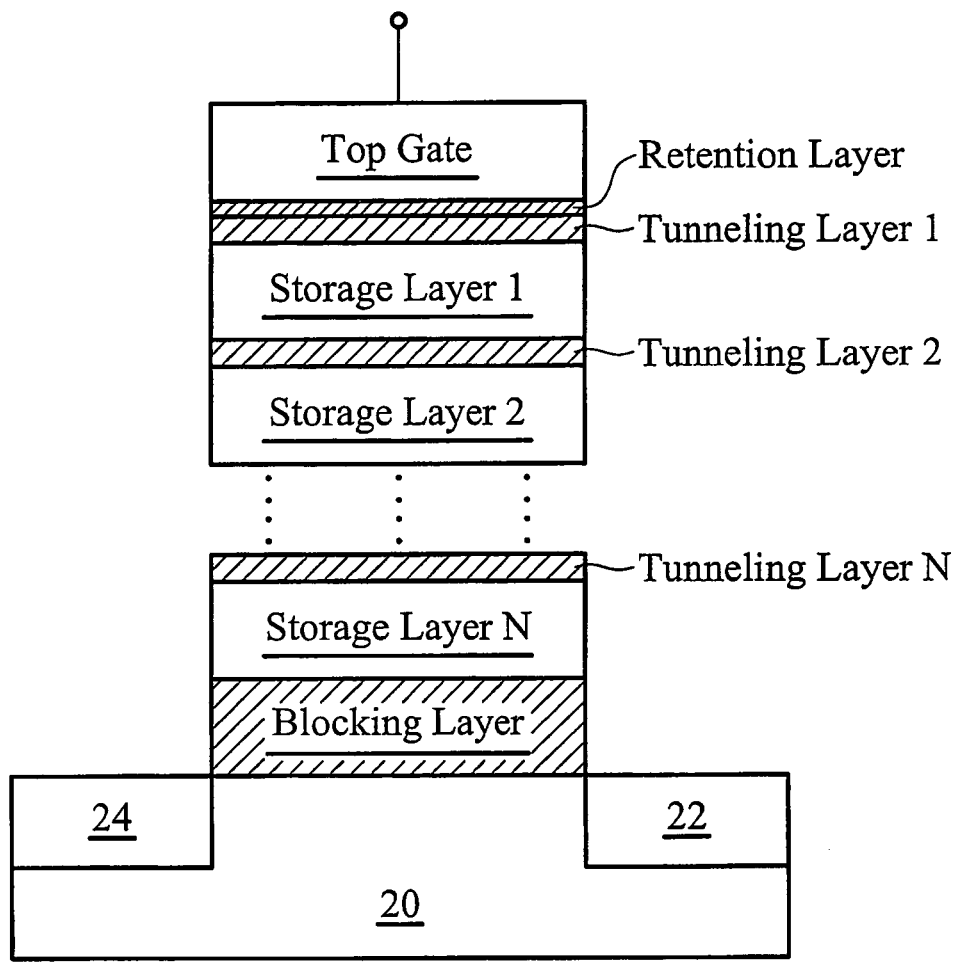

FIG. 12 illustrates a further variation of the embodiment shown in FIG. 11, wherein a retention layer is formed between tunneling layer 1 and the top gate to improve the charge retention ability. The preferred materials and the mechanism have been discussed using FIGS. 9A and 9B, and thus are not repeated herein.

The preferred embodiments of the present invention can be used for storing multiple bits. By adjusting the make up of the tunneling layers and storage layers, not only is the performance of the MTL memory cells high, but the data retention time is also long.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a semiconductor substrate;
a top gate over the semiconductor substrate;
a stacked gate between the top gate and the semiconductor substrate, wherein the stacked gate comprises:
a first tunneling layer having a first band gap;
a first storage layer adjoining the first tunneling layer, the first storage layer having a second band gap smaller than the first band gap; and
an additional layer adjoining the first tunneling layer, wherein the additional layer comprises a second storage layer adjacent the first tunneling layer and a second tunneling layer, the second storage layer having a third band gap and the second tunneling layer having a fourth band gap, the fourth band gap being smaller than the first band gap, the third band gap being smaller than the fourth band gap;
a blocking layer adjoining and contacting the first storage layer, the blocking layer having a fifth band gap larger than the first band gap, wherein the first and the second tunneling layers each comprises $SiO_2$ and an additional material selected from the group consisting essentially of silicon, nitrogen, and combinations thereof, and wherein the first tunneling layer has a lower additional material concentration than does the second tunneling layer; and
a retention layer between the additional layer and the semiconductor substrate, the retention layer having a sixth band gap, the sixth band gap being larger than the fourth band gap.

2. The semiconductor device of claim 1, wherein the blocking layer is adjacent to the top gate.

3. The semiconductor device of claim 1, wherein the first tunneling layer has a lower additional material concentration than does the second tunneling layer.

4. The semiconductor device of claim 1, wherein the stacked gate and the top gate wrap around two sidewalls of a semiconductor strip on the semiconductor substrate.

5. The semiconductor device of claim 1, further comprising a source/drain region in the semiconductor substrate and adjacent the stacked gate.

6. The semiconductor device of claim 1, wherein the first storage layer and the second storage layer comprise a material selected from the group consisting essentially of a high-k dielectric material, silicon nitride, AlN, AlGaN, nano crystal, and combinations thereof.

7. A semiconductor device comprising:
a semiconductor substrate;
at least two composite layers stacked over the semiconductor substrate, wherein each of the at least two composite layers comprises a tunneling layer and a storage layer on the tunneling layer, wherein at least one of the storage layers separates two of the tunneling layers, and wherein each tunneling layer in the at least two composite layers has a larger band gap than band gaps of underlying tunneling layers, and wherein the tunneling layers in the at least two composite layers comprise different materials;

a blocking layer adjoining one of the storage layers of the at least two composite layers;

a top gate over the blocking layer; and a source/drain region in the semiconductor substrate and adjacent the at least two composite layers.

8. The semiconductor device of claim 7, wherein each tunneling layer in the at least two composite layers comprises $SiO_2$ and an additional material selected from the group consisting essentially of silicon, nitrogen and combinations thereof, and wherein each tunneling layer has a lower additional material concentration than do the underlying tunneling layers.

9. The semiconductor device of claim 7 further comprising a retention layer between the at least two composite layers and the semiconductor substrate, wherein the retention layer has a band gap greater than a band gap of an adjoining tunneling layer in the at least two composite layers, and a thickness less than about 50% of a thickness of the adjoining tunneling layer.

10. The semiconductor device of claim 9, wherein the retention layer comprises substantially pure $SiO_2$.

11. The semiconductor device of claim 9, wherein the retention layer has a greater band gap than $SiO_2$ having impurities.

12. A semiconductor device comprising:

a semiconductor substrate;

a retention layer on the semiconductor substrate;

a plurality of composite layers stacked on the retention layer, wherein each of the composite layers comprises a tunneling layer and a storage layer on the tunneling layer, at least one of the storage layers adjacent to and separating two of the tunneling layers, wherein the retention layer has a greater band gap than an adjoining tunneling layer, wherein each tunneling layer in the plurality of composite layers has a greater band gap than band gaps of underlying tunneling layers; wherein each storage layer in the plurality of composite layers has a band gap smaller than each tunneling layer in the plurality of composite layers, and wherein each storage layer in the plurality of composite layers has a same band gap;

a blocking layer over the plurality of composite layers, the blocking layer having a band gap greater than each tunneling layer in the plurality of composite layers;

a top gate over the blocking layer; and a source/drain in the semiconductor substrate and adjacent the retention layer.

13. The semiconductor device of claim 12, wherein the retention layer has a thickness of less than about 50% of a thickness of the adjoining tunneling layer.

14. The semiconductor device of claim 13, wherein the retention layer comprises substantially pure $SiO_2$, and wherein the retention layer has a band gap greater than a band gap of $SiO_2$ having impurities.

15. The semiconductor device of claim 12, wherein tunneling layers in the plurality of composite layers comprise different materials.

16. The semiconductor device of claim 12, wherein tunneling layers in the plurality of composite layers each comprises $SiO_2$ and an additional material selected from the group consisting essentially of silicon, nitrogen, and combinations thereof, and wherein each tunneling layer in the plurality of composite layers has a lower concentration of the additional material than the underlying tunneling layers.

17. The semiconductor device of claim 12, wherein at least one of the storage layers comprises a material selected from the group consisting essentially of a polysilicon, a metal-containing material, AlN, AlGaN, nano crystal, and combinations thereof.

18. A semiconductor device comprising:

a semiconductor fin on a top surface of a substrate, the semiconductor fin having two sidewalls and a top surface, wherein the semiconductor fin comprises a middle channel section and two source/drain regions;

a top gate over the top surface and around the two sidewalls of the semiconductor fin;

a stacked gate extending from the top gate to the semiconductor fin along the top surface and the two sidewalls of the semiconductor fin, wherein the stacked gate comprises a composite layer, the composite layer comprising a first tunneling layer and a first storage layer adjoining the first tunneling layer, the stacked gate comprising a same number of tunneling layers as storage layers;

a retention layer adjoining the composite layer at a first side;

an additional composite layer adjoining the composite layer at a separate side opposite the first side, wherein the additional composite layer comprises a second tunneling layer and a second storage layer; and a blocking layer adjoining the second storage layer, wherein the second tunneling layer has a greater band gap than the first tunneling layer, the first and second storage layers have a first band gap, the first band gap being smaller than the band gap of the first tunneling layer, and the blocking layer has a band gap greater than the band cap of the second tunneling layer.

19. The semiconductor device of claim 18, wherein the stacked gate comprises three storage layers and three tunneling layers.

20. The semiconductor device of claim 18, wherein at least one of the first and second storage layers comprises a material selected from the group consisting essentially of a polysilicon, a metal-containing material, AlN, AlGaN, nano crystal, and combinations thereof.

* * * * *